(12) United States Patent
Carreto et al.

(10) Patent No.: US 7,362,176 B2
(45) Date of Patent: Apr. 22, 2008

(54) HIGH EFFICIENCY LINEAR AMPLIFIER

(75) Inventors: Maria-Flora Carreto, Richardson, TX (US); Charles Parkhurst, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 11/061,332

(22) Filed: Feb. 18, 2005

(65) Prior Publication Data

US 2006/0186958 A1    Aug. 24, 2006

(51) Int. Cl.
*H03F 3/26* (2006.01)
(52) U.S. Cl. .................................................. 330/267
(58) Field of Classification Search ................ 330/267, 330/273, 263, 260, 265, 102, 292
See application file for complete search history.

(56) References Cited

U.S. PATENT DOCUMENTS

| | | | |
|---|---|---|---|
| 6,262,633 B1 * | 7/2001 | Close | 330/267 |
| 6,380,801 B1 * | 4/2002 | McCartney | 330/9 |
| 6,552,613 B2 * | 4/2003 | Murray et al. | 330/255 |
| 6,794,943 B2 | 9/2004 | Gibson et al. | |
| 7,224,227 B1 * | 5/2007 | Kumar | 330/255 |

OTHER PUBLICATIONS

Gilbert, B., "A New Wide-Band Amplifier Technique," IEEE J. Solid State Circuits, vol. SC-3, No. 4, Dec. 1968, pp. 353-365.

Horowitz, P., et al., "The Art of Electronics," Cambridge Univ. Press, 2nd Ed., 1989, pp. 98-104.

Kih, J., et al., "Class AB Large-Swing CMOS Buffer Amplifier with Controlled Bias Current," IEEE J. Solid-State Circuits, vol. 28, No. 12, Dec. 1993, pp. 1350-1353.

Minch, B. A., et el., "The Multiple-Input Translinear Element: A Versatile Circuit Element," Proc. 1998 IEEE International Symposium on Circuits and Systems, vol. 1, May 31, 1998, pp. 527-530.

* cited by examiner

*Primary Examiner*—Robert J. Pascal
*Assistant Examiner*—Alan Wong
(74) *Attorney, Agent, or Firm*—Wade J. Brady, III; Frederick J. Telecky, Jr.

(57) ABSTRACT

A linear amplifier is configured with a current-feedback amplifier followed by a voltage-feedback amplifier to drive a totem-pole output stage. The output stage includes a series arrangement of an npn transistor and a pnp transistor with their emitters coupled in series and to an output node. The voltage amplifier driving the output stage is also configured with totem-pole elements, wherein a conductive path between the voltage-feedback amplifier and an output transistor is included to reduce conduction of the output transistor when the opposing output transistor is driven to increase conduction as a result of a high-frequency input signal. A capacitor may be included between the collector and base of a transistor in the circuit path that drives an output transistor in the output stage to briefly reduce its conduction when the opposing output transistor is driven to increase conduction.

18 Claims, 4 Drawing Sheets

HIGH EFFICIENCY LINEAR AMPLIFIER

TECHNICAL FIELD

Embodiments of the present invention relate generally to electronic systems and in particular to operational amplifiers. Particular embodiments relate to using operational amplifiers configured with current- and voltage-feedback amplifier stages.

BACKGROUND

Operational amplifiers are a basic building block in electronic systems, and their performance broadly affects the overall performance of the systems in which they are embedded. The performance of operational amplifiers has been generally limited by the underlying characteristics of the transistors and other components with which they are built. Such component limitations directly affect the maximum bandwidth of the amplifier, its gain, and the efficiency with which it can amplify signals.

Substantial progress has been made in the development of new amplifier circuits for applications requiring high amplifier performance since the invention of the transistor in the late 1940s. The familiar textbook transistor voltage amplifier, using a resistor in series with the collector and a grounded emitter, has been substantially replaced by current-based configurations using a compensating transistor directly coupled to the base of an amplifying transistor to provide current feedback. This approach, which is also referred to as a translinear circuit or translinear loop, substantially improves linearity and provides inherent temperature compensation. This circuit and variations are described in B. Gilbert, "A New Wide-Band Amplifier Technique," IEEE J. Solid State Circuits, Vol. SC-3, No. 4, December 1968, pp. 353-365, which is incorporated herein by reference. Translinear circuit elements are described by B. A. Minch, et al., "The Multiple-Input Translinear Element: A Versatile Circuit Element," Proc. 1998 IEEE International Symposium on Circuits and Systems, Vol. 1, 31 May 1998, pp. 527-530, which is referenced and incorporated herein. Current mirrors are now also used to couple the output of one amplifying stage to the input of another without the need for frequency-limiting coupling capacitors as described in P. Horowitz, et al., "The Art of Electronics," Cambridge Univ. Press, 2nd Ed., 1989, pp. 98-104, which is incorporated herein by reference. Low impedance circuit nodes associated with current amplification in present amplifiers substantially eliminate the otherwise unavoidable high-frequency poles associated with circuit parasitic capacitance and enable the design of amplifiers with bandwidths approaching the underlying transistor frequency $f_T$, the frequency at which the current gain of a transistor falls to unity. Differential amplifiers provide input signal symmetry and are readily configured with paired transistors. Class AB input amplifiers achieve high efficiency by alternately conducting current with some current overlap through the two output transistors depending on the polarity of the input signal. Class AB amplifiers with sufficient feedback can still provide high levels of linearity and high gain, and can be arranged with further symmetry with respect to the bias supply by totem-pole circuits employing complementary transistor types. Such circuits are described, for example, by N. Gibson, et al. in U.S. Pat. No. 6,794,943, which is hereby referenced and incorporated herein. The overall result of these developments is circuits with amplifying bandwidth from dc to almost the $f_T$ of the constituent transistors, and with high levels of linearity. Stable amplification gains are thereby provided that are substantially independent of temperature but are dependent principally on the ratio of transistor areas.

Nonetheless, new applications for high bandwidth amplifiers continue to challenge previously obtainable results and present new needs for amplifiers with even better linearity while maintaining wide amplification bandwidth. High output drive capability and high gain are also often required. An example of such a need is for xDSL telephone circuits that accurately transmit high data-rate signals to modems on remote customer premises. A digital subscriber line, or DSL, can be configured in various arrangements, one of which is an asymmetric digital subscriber line, or ADSL, that transmits data at different rates depending on the direction of transmission; a generic descriptor for a DSL in one of various possible arrangements is "xDSL." These xDSL applications utilize signals with frequency components exceeding 10 MHz and require minimal signal distortion for reliable data transmission. These applications also require the high amplification efficiency ordinarily associated with Class AB amplifiers to prevent overheating, but as the signal bandwidths continue to be extended beyond 10 MHz, the normal high efficiency of Class AB amplifiers is compromised by prior-art approaches that generally exhibit some level of current shoot-through in the last amplification stage that drives the output signal. This shoot-through results in power increase and degradation in linearity that can be at least proportional to the frequency of the signal being amplified. Thus, a new circuit approach is required to satisfy these applications without undue degradation in system performance, and that can use ordinary silicon components without introducing unnecessary power dissipation.

FIG. 1 shows a cascade circuit arrangement for a wide bandwidth amplifier of the prior art, illustrated generally as the amplifier 100, and is identified herein as Version 1. This circuit utilizes two cascade-coupled current-feedback amplifier stages driving a power output stage, and produces an output voltage $V_{OUT}$ from differential input voltage signals $V_{IN}+$ and $V_{IN}-$. The amplifier 100 typically operates as a Class AB amplifier to provide high amplification efficiency. The amplifier 100 is configured with a first current-feedback amplifier sub-circuit including the bipolar transistors Q1, Q2, Q3, and Q4 arranged as a generally symmetric differential current-feedback amplifier, and is supplied with constant and substantially equal currents from the current sources I1 and I2. The areas of transistors Q1, Q2, Q3, and Q4 are also generally equal. The transistors Q2 and Q4 can alternatively be configured as emitter followers as is well understood in the art. Current-feedback amplifiers are generally used in such applications because they can provide high slew rates, usually with good linearity, in response to high-frequency input signals. The current sources I1 and I2 are coupled respectively to the positive and negative bias rails $V_{CC}$ and $V_{EE}$. Currents supplied by these current sources may be on the order of 0.1 mA, but other current levels can be used to meet the needs of a particular application.

The output currents from this non-symmetric input buffer subcircuit are reflected by current mirrors CM1 and CM2 to provide input currents for a second, current-feedback amplifier sub-circuit configured with bipolar transistors Q5, Q6, Q7, and Q8. The current mirrors CM1 and CM2 are usually configured with unity gain but can be arranged to provide current gain by altering the ratio of their constituent transistor areas as is well known in the art. The areas of transistors Q5, Q6, Q7, and Q8 are also usually equal.

Transistors Q5 and Q7 are arranged in a diode-coupled circuit configuration to provide dc bias for transistors Q6 and Q8. A high-impedance node, node A, is formed at the junction of the emitters of transistors Q5 and Q7 and is by-passed to the negative bias rail $V_{EE}$ with compensation capacitor C1 to provide low impedance for signal components of interest and stable operation. The output currents from this second, current-feedback amplifier sub-circuit produced at the collectors of transistors Q6 and Q8 are reflected by current mirrors CM3 and CM4, also usually configured with unity gain, and are coupled to a unity gain buffer configured with bipolar transistors Q9, Q10, Q11, and Q12. The areas of transistors Q9, Q10, Q11, and Q12 are usually equal. Transistors Q9 and Q11 are arranged in a diode-coupled circuit configuration to provide dc bias for transistors Q10 and Q12. Transistors Q9, Q10, Q11, Q12, Q13, Q14, Q15, and Q16 constitute a buffered amplifier for the output signal $V_{OUT}$. A high-impedance node is formed at node C, the junction of the emitters of transistors Q9 and Q11, and is by-passed to the negative bias rail $V_{EE}$ with compensation capacitor C2, again to provide a low impedance for signal components of interest and stable operation. The output node of this third sub-circuit is coupled to a further current mirror configured with bipolar transistors Q15 and Q16 and another current mirror configured with bipolar transistors Q13 and Q14 that are arranged to drive the output signal $V_{OUT}$. The transistors Q14 and Q16 are large to support the high output-current driving ability of the amplifier, and are indicated on the figure as being N times larger than the transistors Q13 and Q15 where N can be substantially larger than unity and by and large is dependent on the system specifications. In practical terms, these ratios should be large enough to maintain low power dissipation and good linearity when driving heavy loads. Thus, the current mirrors configured with bipolar transistors Q15 and Q16 and transistors Q13 and Q14 have current gains of approximately N:1.

The output, $V_{OUT}$, from the amplifier 100, is coupled through the resistor R1 to an inverting node, node B, of this cascaded amplifier arrangement to provide negative feedback to configure the gain of this portion of the amplifier 100. The current gain and stability of the amplifier 100 depend on the resistor $R_1$.

A significant limitation of the circuit configuration illustrated in FIG. 1 is the high level of bias current that is drawn when amplifying signals with high-frequency components such as encountered in xDSL applications. This is a consequence of current "shoot through" resulting from the substantial collector-to-base junction capacitance of the large output transistors Q14 and Q16. When transistor Q16 is turned on by a high-frequency signal, the output voltage $V_{OUT}$ increases and an incremental current flows into node D due to the collector-to-base junction capacitance of transistor Q14. This current divides between the bases of transistors Q13 and Q14, but substantially all of the current flows into the base of transistor Q14 due to its larger area. The current moderately raises the voltage of node D because it is coupled to bases of two transistors with grounded emitters, and thereby briefly turns on transistor Q14 by the current that is caused to flow though the collector-to-base junction capacitance of transistor Q14 by the increasing voltage difference between its collector and base. Thus, a current shoot-through path is formed from the $V_{CC}$ bias rail to the $V_{EE}$ bias rail that can result in power dissipation for each cycle of the high-frequency signal being amplified. If the frequency components of the input signal are sufficiently high, the power dissipated is significant. A similar dissipative path is formed for current resulting from quickly varying voltage across the collector-to-base junction capacitance of transistor Q14 when the output voltage $V_{OUT}$ is rapidly decreasing. The voltage of node E is correspondingly reduced, briefly turning on transistor Q16 by the current that is caused to flow though the collector-to-base junction capacitance of transistor Q16 by the increasing voltage difference between its collector and base. Again, shoot-through results for each cycle of the high-frequency signal. Thus, substantial power is dissipated by the circuit in FIG. 1 when amplifying signals with high-frequency components, particularly above 10 MHz such as for xDSL type signals. The power dissipation is a consequence of the totem-pole arrangement of the output portion of the amplifier and the uncompensated collector-to-base capacitance of the output transistors with collectors coupled in series and to the output. Such high power dissipation results in low amplifier efficiency and even component damage if sufficient heat-sinking arrangements are not provided for the power-dissipating circuit elements. Although this circuit can be configured with high voltage gain, it also does not provide sufficient amplification linearity for high performance xDSL applications.

FIG. 2 shows another cascade arrangement of two current-feedback amplifier stages of the prior art, illustrated generally as the amplifier 200, and identified herein as version 2. Amplifier 200 also utilizes two cascade-coupled current-feedback amplifier stages driving a power output stage to produce an output voltage $V_{OUT}$ from a differential input signal $V_{IN}+$ and $V_{IN}-$. This second version can provide better amplification linearity than the first version illustrated in FIG. 1, but exhibits even worse shoot-through and attendant lower efficiency than the circuit illustrated on FIG. 1, particularly when amplifying signals with frequency components greater than 10 MHz.

The amplifier 200 includes current sources I1 and I2 and transistors Q1, Q2 . . . Q8 that are similar to corresponding circuit elements on FIG. 1 with the same reference designations and will not be re-described in the interest of brevity. The current sources I3 and I4 replace the current mirrors CM3 and CM4 illustrated on FIG. 1 and typically provide equal currents to bias the collectors of transistors Q6 and Q8. These currents are not necessarily equal to the currents from current sources I1 and I2. The output current signals from transistors Q6 and Q8 are coupled to transistors Q19 and Q20 which are biased by bias sources $BIAS_A$ and $BIAS_B$. These bias sources may be configured, for example, with translinear loops as illustrated and described below with reference to FIG. 3a to provide a stable dc operating point for transistors Q19 and Q20. Other bias schemes could be used. Transistors Q19 and Q20 are typically larger than transistors Q1, Q2 . . . Q8 to provide sufficient drive for the output stage. Capacitors C5 and C6 provide added Miller compensation for the second stage of the amplifier beyond that normally provided by the intrinsic collector-to-base capacitance of the transistors and are included to split high-frequency poles in the circuit for added stability. Transistors Q23 and Q25 provide linearized and temperature-corrected bias voltage for the output transistors Q24 and Q26. The area ratio of Q23 to Q24 is 1:M as indicated on the figure, where M is usually substantially greater than unity and by and large is determined by system requirements and process parameters. The area ratio of Q25 to Q26 is also 1:M. The resistor R2 injects a feedback current signal dependent on the output voltage $V_{OUT}$ into the node B, which is a low impedance signal-inverting node for the current feedback amplifier—stage 2. The resistor R2 is usually selected to provide unity gain for the current feedback amplifier—stage 2. The resistor R2 also affects circuit bandwidth and stability.

The amplifier 200 illustrated on FIG. 2 also exhibits shoot-through because Q19 and Q20 have substantial Miller compensation capacitance plus the parasitic collector-to-base capacitance that forms a dynamic current path for high-frequency signals that is in phase between the base of Q19 and the base of Q20. An unwanted increase in signal current is directly coupled to the output stage that in turn amplifies the current, producing a shoot-through current pulse. The output stage is configured with large-area transistors Q24 and Q26 that provide the further current pulse amplification. Thus, a current shoot-through path is formed from the $V_{CC}$ bias rail to the $V_{EE}$ bias rail that can result in significant power dissipation, and substantial power is dissipated by the circuit on FIG. 2, particularly when amplifying signals with frequency components above 10 MHz, again due to the totem-pole arrangement of the output portion of the amplifier and the uncompensated collector-to-base capacitance of the output transistors, this time with emitters coupled in series and to the output.

Thus, linear amplifiers employing circuits of the prior art have limited utility in xDSL and other wide bandwidth applications requiring high efficiency. Wide bandwidth signals ordinarily incur unnecessary power losses using totem-pole circuit configurations of the prior art due to current shoot-through, particularly when utilizing two transistors of substantial area and configured either with emitters or collectors coupled in series. A need thus exists for further improvement to these circuits to reduce or eliminate shoot-through without compromising circuit linearity, bandwidth, gain, or output drive capability.

SUMMARY OF THE INVENTION

In one aspect, the present invention relates to utilizing a voltage feedback amplifier stage to drive a totem-pole output stage. The voltage feedback amplifier stage can in turn be driven by a current-feedback amplifier stage. In an exemplary application, the amplifier is configured to drive an xDSL load which requires an amplification bandwidth exceeding 10 MHz with substantial linearity and gain. The design and efficient manufacture of amplifiers with high gain, linearity, and wide bandwidth without compromising power efficiency for such loads is thereby enabled.

Embodiments of the present invention achieve technical advantages by configuring a linear amplifier circuit with a voltage feedback amplifier to drive a totem-pole output stage. Preferably the output stage of the linear amplifier circuit is configured as a Class AB amplifier. Preferably, the output stage of the linear amplifier circuit includes a series arrangement of an npn output transistor and a pnp output transistor with their emitters coupled together and to an output node. Preferably, the output transistors are driven with their bases coupled to the bases of feedback compensating transistors arranged in a diode configuration. Preferably, the output stage is driven by a voltage amplifier also configured with totem-pole elements wherein a conductive path is included to reduce conduction of an output transistor in the output stage when the opposing output transistor is driven to increase conduction as a result of a high-frequency input signal. Preferably a current-feedback amplifier stage is included to drive the voltage feedback amplifier stage. And preferably, a capacitor is included between the collector and base of a transistor in the circuit path that drives an output transistor in the output stage to briefly reduce its conduction when the opposing output transistor is driven to increase conduction as a result of a high-frequency input signal. Preferably, the linear amplifier is configured with high gain to produce high amplification linearity.

Embodiments of the present invention achieve technical advantages by configuring an xDSL communication system with a linear amplifier circuit employing a voltage feedback amplifier to drive a totem-pole output stage. Preferably, the output stage driving an xDSL line is configured as a Class AB amplifier. Preferably, the output stage includes a series arrangement of an npn output transistor and a pnp output transistor with their emitters coupled together and to an output node. Preferably, the output transistors are driven with their bases coupled to the bases of feedback compensating transistors arranged in a diode configuration. Preferably, the output stage is driven by a voltage amplifier, also configured with totem-pole elements wherein a conductive path is included to reduce conduction of an output transistor in the output stage when the opposing output transistor is driven to increase conduction as a result of a high-frequency input signal. Preferably, a current-feedback amplifier stage is included to drive the voltage feedback amplifier stage. And preferably, a capacitor is included between the collector and base of a transistor in the circuit path that drives an output transistor in the output stage to briefly reduce its conduction when the opposing output transistor is driven to increase conduction as a result of a high-frequency input signal. Preferably, the linear amplifier is configured with high gain to produce high amplification linearity.

Another embodiment of the present invention is a method of configuring a linear amplifier circuit by coupling a voltage feedback amplifier in a cascade arrangement to drive a totem-pole output stage. Preferably the method includes configuring the output stage as a Class AB amplifier. Preferably, the method includes configuring the output stage with a series arrangement of an npn output transistor and a pnp output transistor with their emitters coupled together and to an output node. Preferably, the method further includes coupling the bases of the output transistors to the bases of feedback compensating transistors arranged in a diode configuration. Preferably, the method includes driving the output stage by a voltage amplifier also configured with totem-pole elements and including a conductive path to reduce conduction of an output transistor in the output stage when the opposing output transistor is driven to increase conduction as a result of a high-frequency input signal. Preferably, the method includes employing a current-feedback amplifier stage to drive the voltage feedback amplifier stage. Preferably, the method further includes coupling a capacitor between the collector and base of a transistor in the circuit path to drive an output transistor in the output stage so as to briefly reduce its conduction when the opposing output transistor is driven to increase conduction as a result of a high-frequency input signal. The capacitor may be included to provide frequency compensation for the voltage-feedback amplifier.

Embodiments of the present invention thereby achieve technical advantages as a linear amplifier with high gain, high linearity, wide bandwidth, high output drive capability, and high power efficiency.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The making and using of the presently preferred embodiments are discussed in detail below. It should be appreciated however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an amplifier circuit configured with a voltage-feedback amplifier stage driving an output amplifier. A current-feedback amplifier stage can also be configured to drive the voltage-feedback amplifier stage. The invention may be applied to an amplifier arrangement to drive an xDSL line for which high gain, wide bandwidth, low distortion, high drive capability, and high efficiency are required; however, the application of the invention is not limited to these applications.

Figure 1:
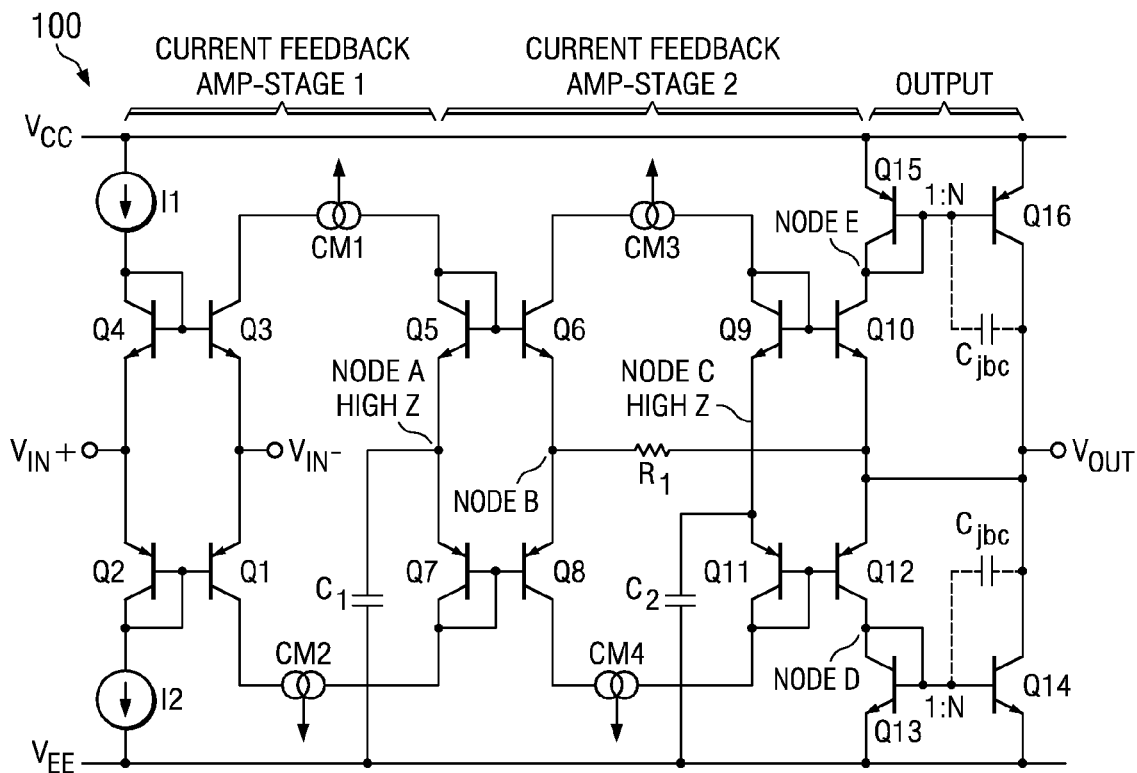
FIG. 1 shows a linear amplifier of the prior art including two cascade-coupled current feedback amplifier stages configured as a line driver to drive an xDSL circuit.
Figure 3:
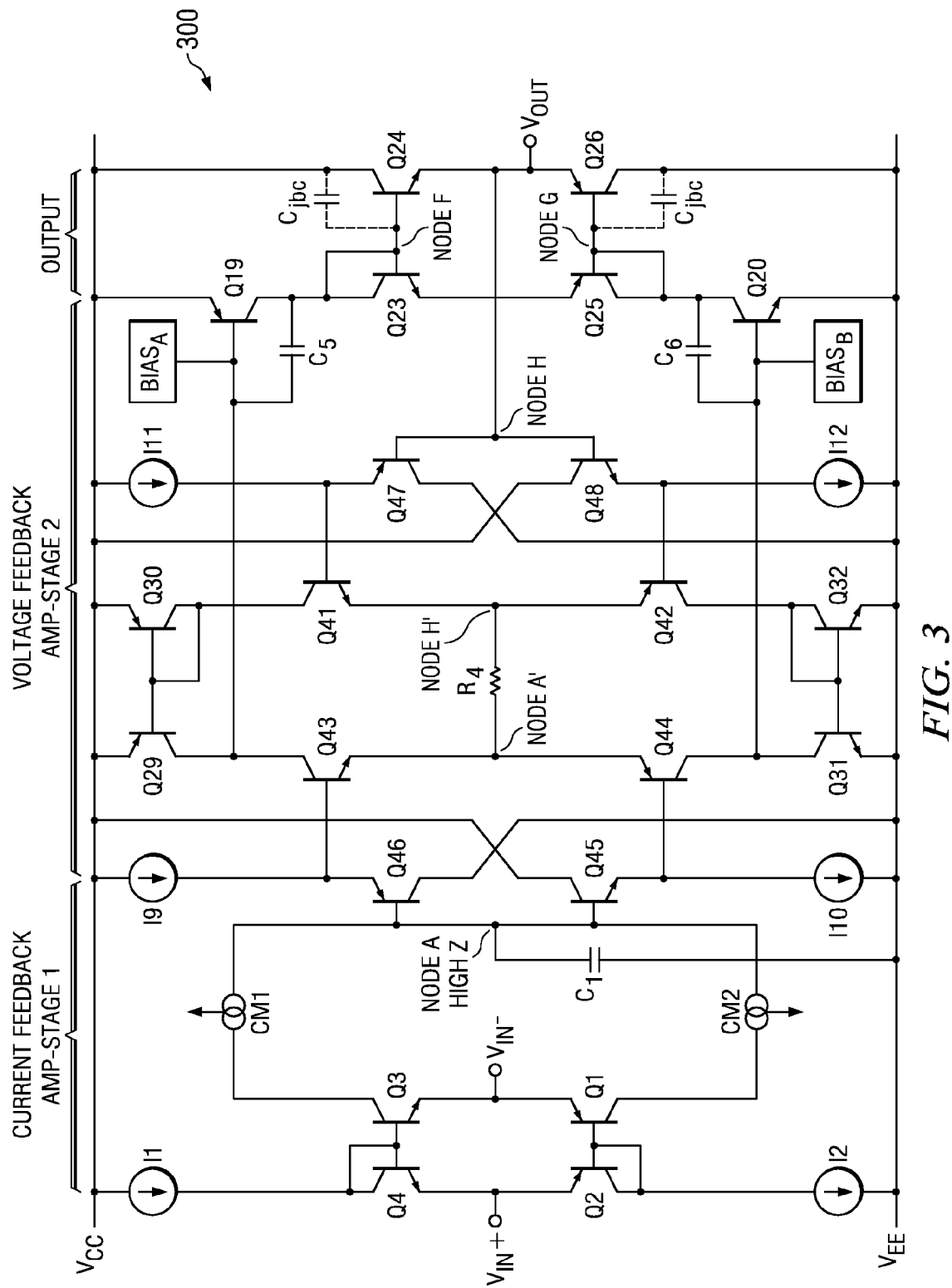
FIG. 3 shows a linear amplifier of the present invention including cascade-coupled current-feedback and voltage-feedback amplifier stages configured as a line driver to drive an xDSL circuit.

Turning now to FIG. 3, illustrated generally as the amplifier 300 of the present invention configured with a current-feedback amplifier stage followed by a voltage feedback amplifier stage driving a power output stage, is described herein as version 3. The amplifier 300 includes current sources I1 and I2 and transistors Q1, Q2 . . . Q4 that are similar in connection and operation to corresponding circuit elements on FIG. 1 with the same reference designations and will not be re-described in the interest of brevity. The differential input signals $V_{IN}+$ and $V_{IN}-$ produce reflected currents from current mirrors CM1 and CM2 that are coupled respectively to the bases of transistors Q46 and Q45. Node A and node H form, respectively, the non-inverting and inverting inputs to a symmetrically arranged voltage-feedback differential amplifier configured with transistors Q29, Q30 . . . Q32 and transistors Q41, Q42 . . . Q48. The current sources I9 and I10 respectively bias the emitters of transistors Q46 and Q45, and current sources I11 and I12 respectively bias the emitters of transistors Q47 and Q48. Transistors Q29 and Q30 and transistors Q31 and Q32 form a symmetric pair of current mirrors for this differential amplifier. The circuit is configured so that the voltage at node A' accurately matches the voltage at node A with very wide bandwidth, such as bandwidths including frequencies higher than 10 MHz, and the voltage at node H' accurately matches the voltage at node H, also with very wide bandwidth. Thus, a voltage difference applied between node A and node H is accurately reproduced across the resistor $R_4$ with very wide bandwidth.

Figure 2:
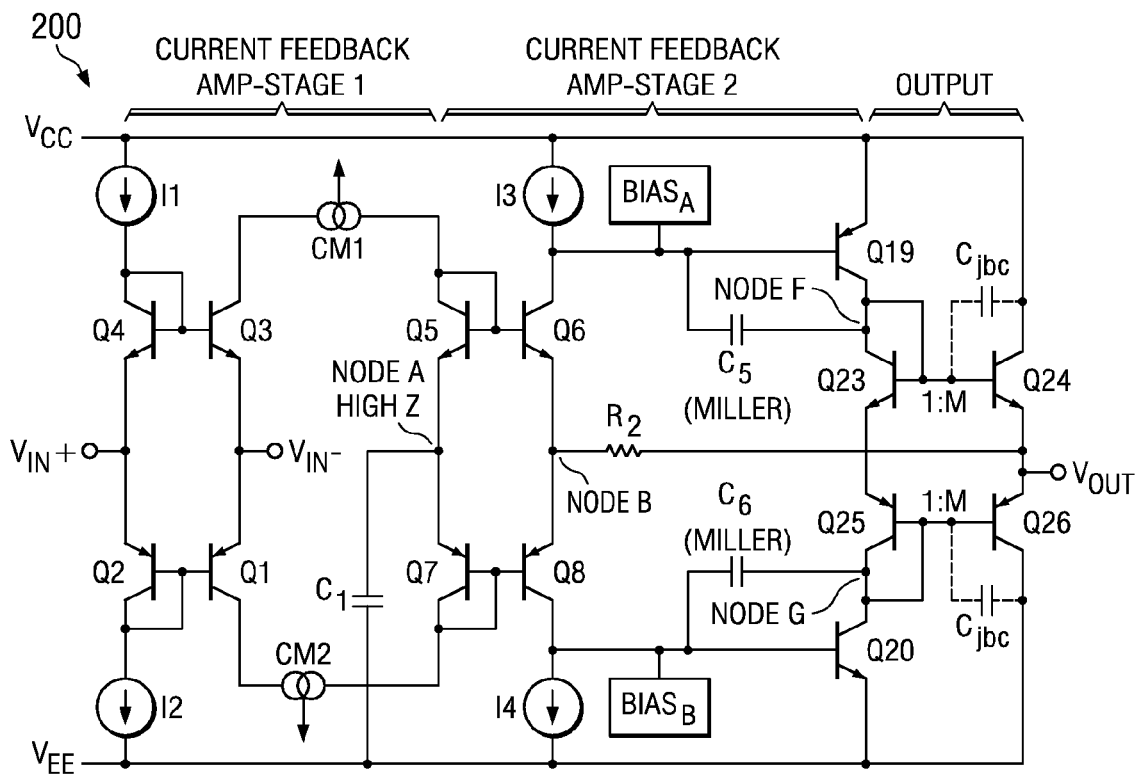
FIG. 2 shows a linear amplifier of the prior art including two cascade-coupled current-feedback amplifier stages configured as a line driver to drive an xDSL circuit.

The output elements of the amplifier 300 including drive transistors Q19 and Q20, current-feedforward transistors Q23 and Q25, output transistors Q24 and Q26, and Miller-enhancing capacitors C5 and C6 are similar to corresponding elements on FIG. 2 with similar reference designations and will not be re-described. The bias sources $BIAS_A$ and $BIAS_B$ may be configured with translinear loops as illustrated and described below with reference to FIG. 3a to provide a stable dc operating point for transistors Q19 and Q20. Alternatively, other bias circuits could be used. In the amplifier 300, the output voltage $V_{OUT}$ is fed back directly to the inverting input node H of the voltage feedback amplifier, thereby providing unity voltage gain for this portion of the circuit.

The circuit of FIG. 3 exhibits substantially less current shoot-through for high frequency signals than the prior art circuits due to a new configuration of the voltage amplifier driving the output section. The circuit is configured using a cascade arrangement of a current feedback amplifier and a voltage feedback amplifier to provide a compensating drive signal to the totem-pole transistor that would ordinarily conduct a brief shoot-through current pulse due to collector-to-base junction capacitance when the voltage of the output node (node H) is rapidly changed. This compensation circuit and its operation can be described as follows: Assume that a high-frequency drive signal from the input current-feedback amplifier turns on transistor Q43, which then turns on transistor Q19, and which is coupled to the output portion of the circuit by added Miller capacitor C5. Transistor Q19 turns on transistor Q24, thereby rapidly raising the output voltage $V_{OUT}$. Transistor Q23 is included to provide current and temperature compensation for the circuit. The signal also passes through feedback resistor $R_4$ and turns on transistor Q42. Diode-configured transistor Q32 conducts, and the signal is quickly reflected through transistor Q31. It is then coupled through added Miller capacitor C6 to raise the voltage of node G, thereby disabling conduction through transistor Q26. Thus, the high-frequency path enabling shoot-through that would otherwise occur through transistors Q19 and Q20 is interrupted, and transistor Q20 is not turned on, relying on the very fast response times of these elements of the circuit. A similar result occurs for a signal from transistor Q44 that does not turn on transistor Q24, avoiding current shoot-through for high-frequency input signals of opposite polarity. By this means current shoot-through is minimized through the output transistors Q24 and Q26, preserving amplifier efficiency for high-frequency signals that is otherwise ordinarily achievable only for lower frequency signals.

Figure 3A:
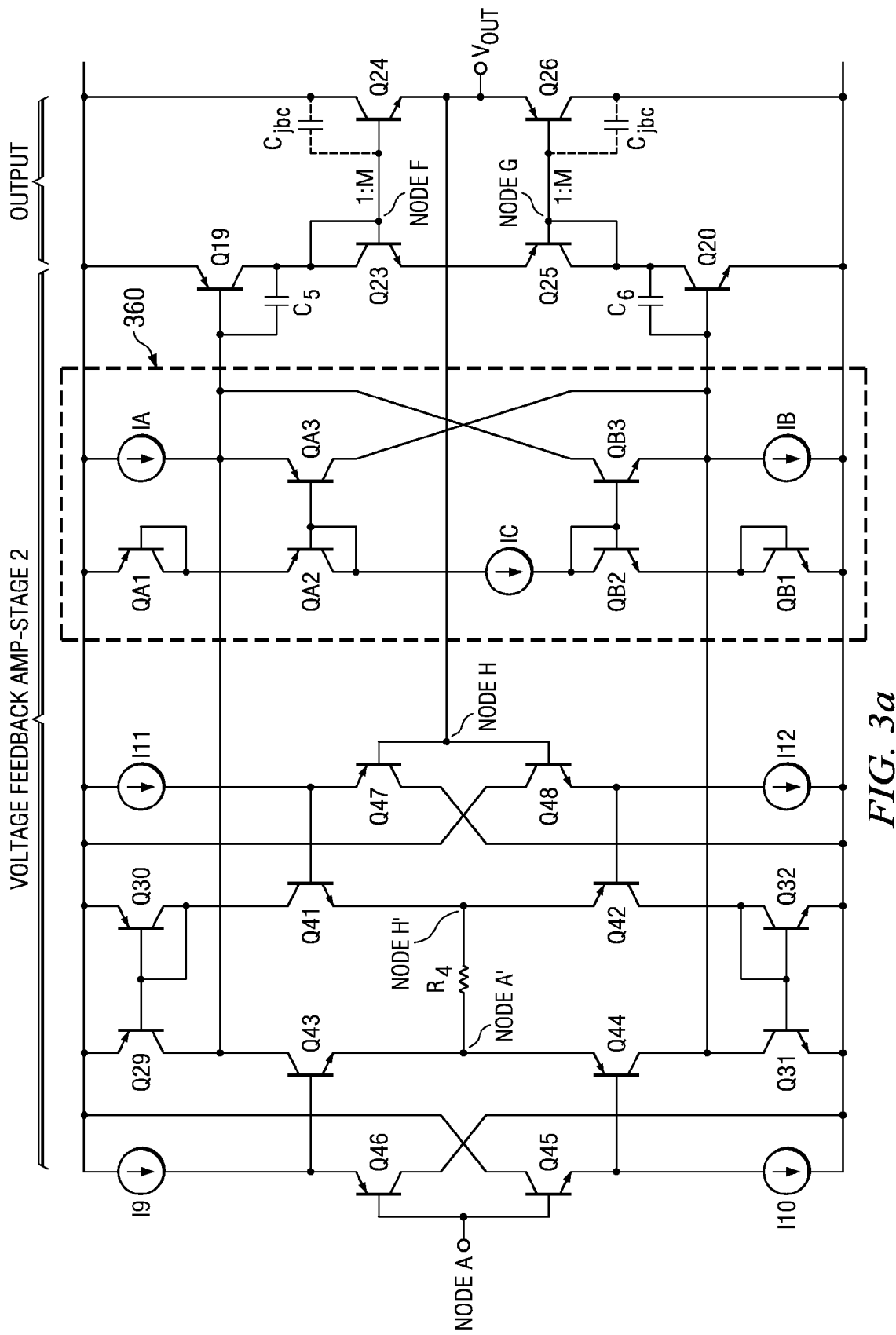
FIG. 3a shows voltage feedback amplifier and output portions of the circuit illustrated in FIG. 3 including a biasing arrangement configured with translinear loops.

Turning now to FIG. 3a, illustrated are voltage feedback amplifier and output portions of the circuit shown on FIG. 3 with an exemplary biasing arrangement 360 for transistors Q19 and Q20 configured with translinear loops. Circuit elements on FIG. 3a that are similar to corresponding elements on FIG. 3 are identified with similar reference designations and will not be redescribed. The input, node A, to the voltage feedback amplifier stage, Stage 2, is driven by the current feedback amplifier stage, Stage 1, as illustrated on FIG. 3. Transistors QA1, QA2, and QA3, and current sources IA and IC provide bias for transistor Q19. Transistors QB1, QB2, and QB3, and current sources IB and IC provide bias for transistor Q20. In a preferred embodiment, the current sources IA, IB, and IC provide equal currents. The implementation of current sources for class AB amplifiers is described in Joongsik Kih, et al., "Class AB Large-Swing CMOS Buffer Amplifier with Controlled Bias Current," IEEE J. Solid-State Circuits, Vol. 28, No. 12, December 1993, which is referenced and incorporated herein.

Figure 4:
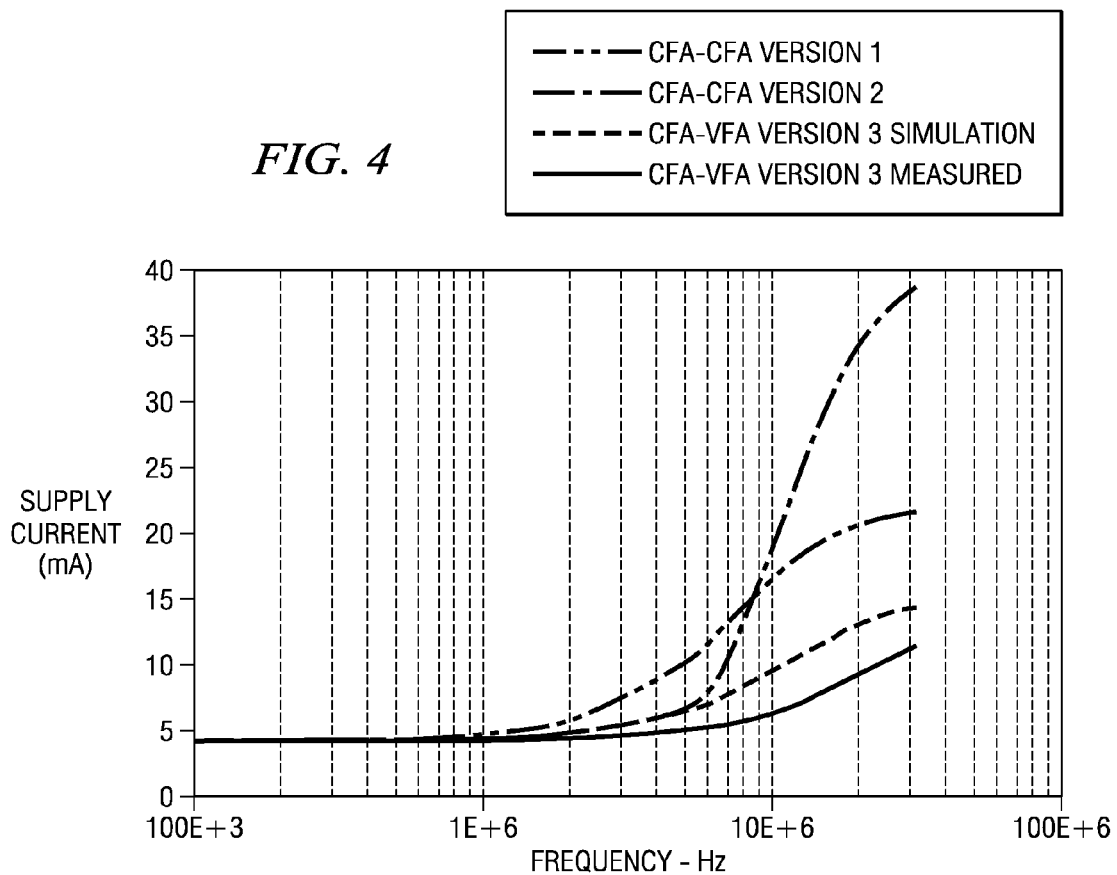
FIG. 4 is a graph comparing the supply current requirement as a function of frequency of the input signal of the amplifier circuits illustrated in FIGS. 1, 2, and 3.

Turning now to FIG. 4, the current drawn by the amplifier from the bias supply for each of the three versions of the amplifier circuit described above is illustrated. Bias supply current is a measure of amplifier efficiency because the product of bias supply current times bias supply voltage is the total amplifier power consumed, assuming the current mirrors are powered by the same bias source. In each case, no load resistance was coupled to the amplifier, which would have added an increment to the bias supply current. Both the simulated and measured current drawn by version 3 of the circuit are shown on the figure. The measured data from a physical circuit of the present invention indicate even better high-frequency efficiency than the simulated data.

For input signals with only low-frequency components, amplifiers can generally be designed to perform similarly with respect to efficiency, because the contribution of shoot-through current, being roughly proportional to the frequency or frequency squared of the signal, is insignificant. However, for input signals with frequency greater than 10 MHz, versions 1 and 2 of the amplifier of the prior art circuits show substantially greater dissipation than version 3, which is configured to provide the internal compensating signal to the output-driving transistors to counteract shoot-through.

The circuit configured as version 3, the circuit of the present invention, can be configured to exhibit the same linearity as the circuit configured as version 2 by providing roughly the same bias current levels. The linearity performance of the version 3 circuit when tested for an input signal of 2 volts peak-to-peak and an overall voltage gain of 5 was entirely adequate for xDSL applications, and it demonstrated efficiency superior to the prior art circuits.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits and circuit elements described herein may be implemented using various integrated circuit technologies or may be configured using discrete components or multiple integrated circuits while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An amplifier circuit, comprising:
a voltage feedback amplifier stage coupled to a totem-pole output stage, the totem-pole output stage configured with a pair of series-coupled output transistors coupled to an output node; and
a conductive path coupling the voltage feedback amplifier to an output transistor in the totem-pole output stage that reduces conduction in the output transistor when the opposite output transistor is driven to increase conduction;
wherein a capacitor is coupled between the collector and base of a transistor in the circuit path that drives an output transistor in the totem-pole output stage to reduce the conduction of the output transistor when the opposite output transistor is driven to increase conduction as a result of a high-frequency input signal.

2. The amplifier circuit as in claim 1 wherein an output transistor in the pair of series-coupled output transistors is of the opposite type from the other transistor in the pair of series-coupled output transistors.

3. The amplifier circuit as in claim 1 wherein the emitters of the series-coupled output transistors are coupled together.

4. The amplifier circuit as in claim 1 wherein the output stage is a Class AB amplifier.

5. The amplifier circuit as in claim 1 wherein the bases of the output transistors are coupled to the bases of feedback compensating transistors arranged in a diode configuration.

6. The amplifier circuit as in claim 1 wherein a current-feedback amplifier stage drives the voltage feedback amplifier stage.

7. A method of configuring an amplifier circuit, comprising:
coupling a voltage feedback amplifier stage to a totem-pole output stage;
configuring the totem-pole output stage with a pair of series-coupled output transistors coupled to an output node; and
providing a conductive path from the voltage feedback amplifier to an output transistor in the totem-pole output stage to reduce conduction in the output transistor when the opposite output transistor is driven to increase conduction, including coupling a capacitor between the collector and base of a transistor in the circuit path that drives an output transistor in the totem-pole output stage to briefly reduce the conduction of the output transistor when the opposite output transistor is driven to increase conduction as a result of a high-frequency input signal.

8. The method according to claim 7 including providing an output transistor in the pair of series-coupled output transistors with a transistor of the opposite type.

9. The method according to claim 7 including coupling the emitters of the series-coupled output transistors together.

10. The method according to claim 7 including operating the output stage as a Class AB amplifier.

11. The method according to claim 7 including coupling the bases of the output transistors to the bases of feedback compensating transistors and arranging the feedback compensating transistors in a diode configuration.

12. The method according to claim 7 including providing a current-feedback amplifier stage to drive the voltage-feedback amplifier stage.

13. An amplifier, comprising:
an input current feedback amplifier first stage with one high impedance input and one low impedance input;
a voltage feedback amplifier second stage connected to be driven by the first stage; and
an output stage connected to be driven by the second stage.

14. The amplifier of claim 13, wherein the output stage has a first output driver coupled to a first output-stage input and a second output driver coupled to a second output-stage input, where the first output driver and the second output driver are complementary; and wherein the second stage has (i) a first second-stage input connected to a high-impedance output of the first stage, (ii) a second second-stage input connected to an output of the output stage, (iii) a first second-stage output connected to a first output-stage input, and (iv) a second second-stage output connected to a second output-stage input.

15. The amplifier of claim 14, wherein when a high-frequency signal at the first second-stage input creates a high-frequency signal at the first second-stage output, the second stage also creates a second high-frequency signal at the second second-stage output where the first high-frequency signal activates the first output driver and the second high-frequency signal deactivates the second output driver.

16. The amplifier of claim 13, wherein the second stage includes first and second buffers with the first buffer input connected to the first stage and the second buffer input connected to the output of the output stage to provide feedback.

17. The amplifier of claim 13 wherein the output stage includes an output transistor and an opposing output transistor; and a conductive path is included in a circuit path that drives the output transistor to reduce its conduction when the opposing output transistor is driven to increase conduction as a result of a high-frequency signal.

18. The amplifier of claim 17, wherein the output transistors comprise a series arrangement of an npn output transistor and a pnp transistor with their emitters coupled together to an output node; and the conductive path comprises a capacitor included between the collector and base of a transistor in the circuit path.

* * * * *